United States Patent

Chou

[11] Patent Number: 6,060,340
[45] Date of Patent: May 9, 2000

[54] PACKING METHOD OF SEMICONDUCTOR DEVICE

[75] Inventor: Li-Kun Chou, Taipei Hsien, Taiwan

[73] Assignee: Pan Pacific Semiconductor Co., Ltd., Taipei, Taiwan

[21] Appl. No.: 09/116,487

[22] Filed: Jul. 16, 1998

[51] Int. Cl.[7] .............................. H01L 21/44; H01L 21/48; H01L 21/50

[52] U.S. Cl. ........................ 438/110; 438/106; 438/107; 438/111

[58] Field of Search ................................. 438/110, 111, 438/106, 107

[56] References Cited

U.S. PATENT DOCUMENTS 5,639,695  6/1997  Jones et al. .
5,744,084  4/1998  Chia et al. .
5,895,222  4/1999  Moden et al. .

Primary Examiner—Kevin M. Picardat
Assistant Examiner—D. Mark Collins
Attorney, Agent, or Firm—Rosenberg, Klein & Lee

[57] ABSTRACT

Disclosed is a packaging method of semiconductor device comprising the following step, preparing a PCB or BGA substrate with array-typed dam formed thereupon; placing a plurality of semiconductor devices into the array-typed dam, and attaching each semiconductor devices onto the dam grid; wire-bonding the semiconductor devices; performing lid-covering or resin-sealing process. The present invention forms the dam structure necessary for the package by an off-line process, and then attaches the dam structure on the substrate. Therefore, the problems of damage of PCB or substrate and short circuit due to the high-temperature and high-pressure pressing process can be prevented, moreover, the yield and the reliability can be enhanced.

4 Claims, 3 Drawing Sheets

PACKING METHOD OF SEMICONDUCTOR DEVICE

FIELD OF THE INVENTION

The present invention relates a semiconductor packaging technology, more particularly to a semiconductor packaging process with enhanced temperature and pressure endurance.

BACKGROUND OF THE PRESENT INVENTION

Over the past decade, packaging becomes increasingly important for microelectronic devices. As the density of semiconductor devices is increasing, the requirement of compactness and reduced-cost for packaging is more demanding.

FIGS. 1A–1D show the conventional packaging process of semiconductor device. Those figures demonstrate the semiconductor device using COB (chip on board) package on PCB or BGA, wherein the semiconductor chips are directly attached on substrate and subjected to wire bonding process.

As shown in FIG. 1A, a substrate 1 is prepared. Then an already-cut die 2 is mounted on and adhered to the substrate 1 by adhesive paste such as silver epoxy. The bounded die is then subjected to a curing process, as shown in FIG. 1B.

Afterward, the die 2 is subjected to a wire bonding process with metal wire 3, as shown in FIG. 1C. The resulting structure is then encapsulated with resin 4 to protect the die 2 therein, as shown in FIG. 1D.

FIGS. 2A–2D show another conventional packaging process of semiconductor device. Those figures demonstrate the semiconductor device using COB (chip on board) package on PCB or BGA, wherein a dam grid is formed on the substrate, and then the semiconductor chip is attached on substrate and subjected to wire bonding process.

As shown in FIG. 2A, a substrate 11 is prepared, wherein a dam grid 10 is formed on the substrate 11 by pressing. Then an already-cut die 12 is mounted on and adhered to the substrate 11 by adhesive paste such as silver epoxy. The bounded die is then subjected to a curing process, as shown in FIG. 2B.

Afterward, the die 12 is subjected to a wire bonding process with metal wire 13, as shown in FIG. 2C. The resulting structure is covered with a transparent lid 14 such as glass lid to seal the package, as shown in FIG. 1D.

However, the above-mentioned COB package employed in PCB or BGA has some drawbacks. For examples, the cost of molding compound is high; moreover, the direct pressing process on substrate is a high-temperature and high-pressure process, which might degrade the reliability of the package.

It is one object of the present invention to provide a semiconductor packaging technology, which does not involve a high-temperature and high-pressure process, therefore, the problems of damage of PCB or substrate and short circuit can be prevented, moreover, the yield and the reliability can be enhanced.

It is another object of the present invention to provide a semiconductor packaging technology, which can reduce the cost of molding die and package, moreover, the die can be attached on substrate with more flexibility.

To achieve above objects, the present invention provide a semiconductor packaging method comprising following processes forming an array-typed dam on a substrate or PCB;

mounting a already-cut die to each dam grid, and adhering the die to the dam grid;

wire-bonding the mounted die;

applying adhesive paste to top surface of each dam, and covering the resultant structure with a transparent lid to ensure the hermeticity of the package.

Moreover, a solder ball array can be formed on the back of the substrate and then the resulting structure is cut into a plurality of single units.

The present invention forms the dam structure necessary for the package by an off-line process, and then attaches the dam structure on the substrate. Therefore, the problems of damage of PCB or substrate and short circuit can be prevented, moreover, the yield and the reliability can be enhanced.

The various objects and advantages of the present invention will be more readily understood from the following detailed description when read in conjunction with the appended drawings, in which:

Figure 1A:
FIGS. 1A–1D show the flowchart of application of COB-type package on conventional PCB or BGA.
Figure 1B:
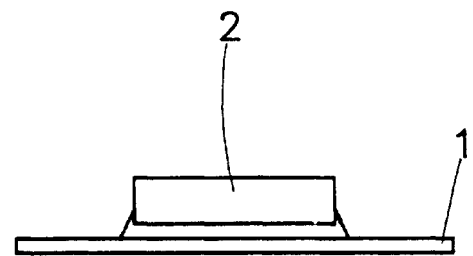
Figure 1C:
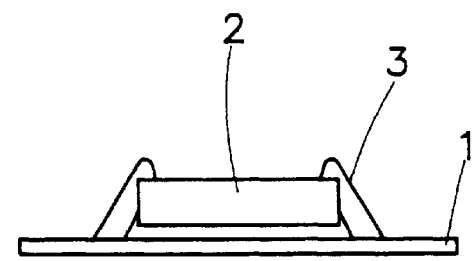
Figure 1D:
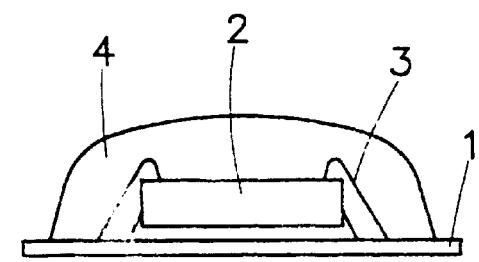
Figure 2A:
FIGS. 2A–2D show flowchart of application of COB-type package on conventional lid-covering type PCB or BGA.
Figure 2B:
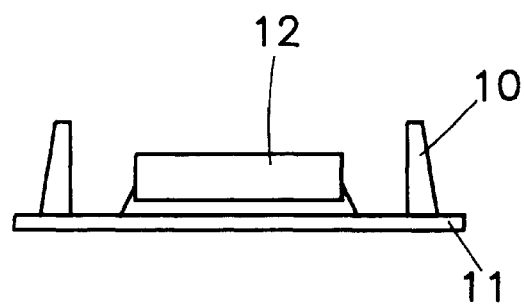
Figure 2C:
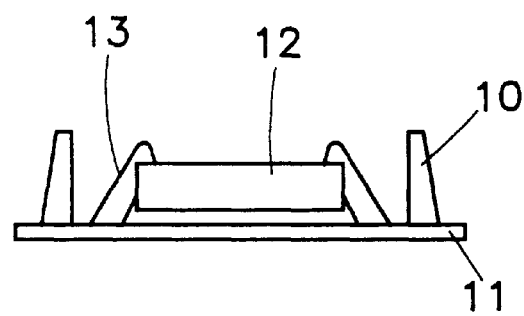
Figure 2D:
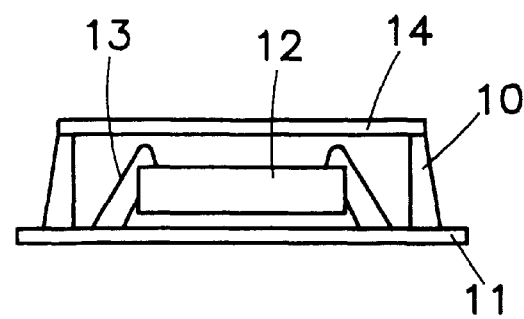

NUMERAL 1 ceramic or plastic substrate
2 die
3 metal wire
4 molding compound
10 dam
11 substrate
12 semiconductor device
13 metal wire
14 lid
20 dam
21 substrate
22 semiconductor device
23 metal wire
24 lid

DETAILED DESCRIPTION OF THE PREFERRED EMBODIMENT

FIGS. 3A–3F show flowchart of the semiconductor package according to a preferred embodiment of the present invention. The preferred embodiment of the present invention is exemplified by a PCB or BGA package. The present invention is intended to provide a packaging process to prevent the damage of PCB or substrate, and to enhance the yield and the reliability.

Figure 3A:
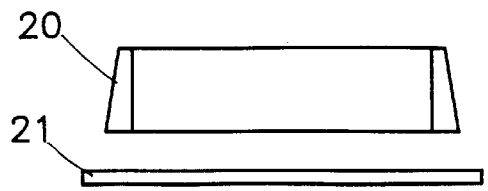
FIGS. 3A–3F show flowchart of the semiconductor package according to a preferred embodiment of the present invention.
Figure 3B:
Figure 3C:
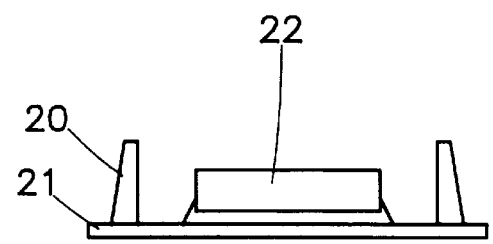
Figure 3D:
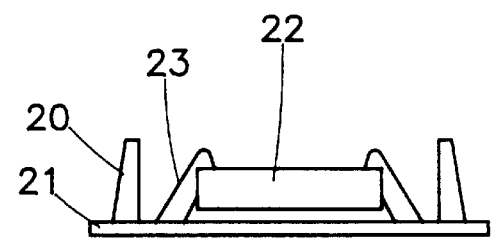
Figure 3F:
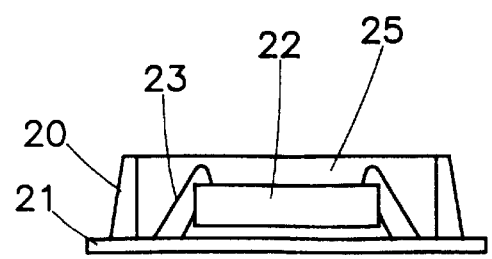
Figure 3E:
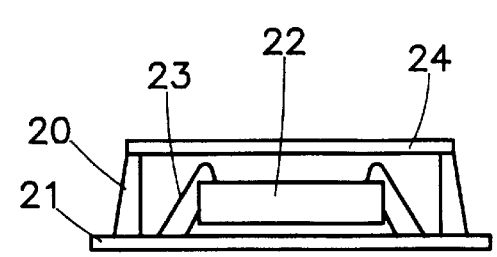

The packing method of the preferred embodiment according to the present invention comprises following steps:

preparing a substrate (or PCB) 21 and forming an array-typed dam 20 in an off-line process, therefore, the high-temperature and high-pressure dam-forming process will not influence the substrate 21, as shown in FIG. 3A;

placing the formed array-typed dam 20 on top of the substrate 21, as shown in FIG. 3B, therefore, the substrate 21 can be provided with latticed dam structure in a more flexible way;

mounting a semiconductor device 22 to each grid of dam 20, and adhering the semiconductor device 2 to the dam 20, as shown in FIG. 3C;

wire-bonding the mounted semiconductor device 22 with wire 23, as shown in FIG. 3D; and covering lid 24 on the dam 20, as shown in FIG. 3E, or encapsulating the package with resin 25, as shown in FIG. 3F, thus completing DCB (direct chip on board) package.

Moreover, the DCB or substrate can be cut into a plurality of single units, thus forming BGA package.

In the inventive packaging method, the formation of dam structure is carried out by an off-line process, and then the dam structure is overlapped on the top of substrate or PCB. In other words, the dam is not directly formed by pressing on the substrate or PCB. Therefore, the problem due to the high-temperature and high-pressure pressing process can be prevented, while the reliability and yield of package can be enhanced.

To sum up, the packaging method according to the present invention can solve the problem of high-temperature and high-pressure pressing process and high molding compound cost encountered in conventional PCB or BGA package, therefore, the cost of molding die and package can be reduced, and the reliability and yield of package can be enhanced.

Although the present invention has been described with reference to the preferred embodiment thereof, it will be understood that the invention is not limited to the details thereof. Various substitutions and modifications have suggested in the foregoing description, and other will occur to those of ordinary skill in the art. For examples, the material of substrate can be varied and the package is not only applicable to PCB or BGA package. Therefore, all such substitutions and modifications are intended to be embraced within the scope of the invention as defined in the appended claims.

I claim:

1. A method of packaging semiconductor devices, comprising the steps of:

(a) providing a substrate;

(b) forming a dam lattice;

(c) securing said dam lattice to said substrate to define an array of a plurality of semiconductor mounting sites;

(d) mounting a plurality of semiconductor devices to said substrate, said plurality of semiconductor devices being respectively located at said array of semiconductor mounting sites;

(e) wire bonding each of said semiconductor devices to said substrate;

(f) sealing said array of semiconductor mounting sites; and, (g) cutting said substrate in correspondence with said array of semiconductor mounting sites to form a plurality of individually packaged semiconductor devices.

2. The method as recited in claim 1 where said step of sealing includes the step of overlaying each of said plurality of semiconductor devices within a respective semiconductor mounting site with a resin.

3. The method as recited in claim 1 where said step of sealing includes the step of overlaying said array of semiconductor mounting sites with a lid.

4. The method as recited in claim 3 where said step of overlaying includes the step of providing a lid formed of glass.

* * * * *